(12) United States Patent
Keenihan et al.

(10) Patent No.: US 8,740,642 B2
(45) Date of Patent: Jun. 3, 2014

(54) CONNECTOR DEVICE FOR BUILDING INTEGRATED PHOTOVOLTAIC DEVICE

(75) Inventors: James R. Keenihan, Midland, MI (US); Joseph A. Langmaid, Caro, MI (US); Gerald K. Eurich, Merrill, MI (US); Michael J. Lesniak, Kawkawlin, MI (US); Michael H. Mazor, Midland, MI (US); Robert J. Cleereman, Midland, MI (US); Ryan S. Gaston, Midland, MI (US)

(73) Assignee: Dow Global Technologies LLC, Midland, MI (US)

( * ) Notice: Subject to any disclaimer, the term of this patent is extended or adjusted under 35 U.S.C. 154(b) by 628 days.

(21) Appl. No.: 12/989,742

(22) PCT Filed: May 1, 2009

(86) PCT No.: PCT/US2009/042492
§ 371 (c)(1),
(2), (4) Date: Apr. 11, 2011

(87) PCT Pub. No.: WO2009/137347
PCT Pub. Date: Nov. 12, 2009

(65) Prior Publication Data
US 2011/0183540 A1    Jul. 28, 2011

Related U.S. Application Data

(60) Provisional application No. 61/050,341, filed on May 5, 2008, provisional application No. 61/098,941, filed on Sep. 22, 2008, provisional application No. 61/149,451, filed on Feb. 3, 2009.

(51) Int. Cl.
*H01R 31/08* (2006.01)
*H01R 12/79* (2011.01)

(52) U.S. Cl.
CPC .................................. *H01R 12/79* (2013.01)
USPC .......................................... 439/510; 439/512

(58) Field of Classification Search
USPC .................................. 439/345, 507, 510, 512
See application file for complete search history.

(56) References Cited

U.S. PATENT DOCUMENTS 4,739,451 A * 4/1988 Kuba .................. 361/679.08
5,227,953 A * 7/1993 Lindberg et al. ......... 361/679.41
(Continued)

FOREIGN PATENT DOCUMENTS

DE        29605510 U1    5/1996
EP         1744372 A2    1/2007
(Continued)

OTHER PUBLICATIONS

International Search Report for PCT/US2009/042492 dated Dec. 8, 2010.

*Primary Examiner* — Tho D Ta
*Assistant Examiner* — Travis Chambers
(74) *Attorney, Agent, or Firm* — The Dobrusin Law Firm, PC

(57) ABSTRACT

The present invention is premised upon a connector device and method that can more easily electrically connect a plurality of PV devices or photovoltaic system components and/or locate these devices/components upon a building structure. It also may optionally provide some additional sub-components (e.g. at least one bypass diode and/or an indicator means) and may enhance the serviceability of the device.

2 Claims, 22 Drawing Sheets

(56) References Cited

U.S. PATENT DOCUMENTS

| | | | |
|---|---|---|---|
| 5,232,518 A * | 8/1993 | Nath et al. | 136/251 |
| 5,590,495 A | 1/1997 | Bressler et al. | |
| 5,626,479 A * | 5/1997 | Hughes | 439/35 |
| 5,961,740 A * | 10/1999 | Wambach et al. | 136/251 |
| 5,986,203 A | 11/1999 | Hanoka et al. | |
| 5,990,414 A | 11/1999 | Posnansky | |
| 6,717,519 B2 * | 4/2004 | Kobayashi et al. | 340/635 |
| 6,840,799 B2 | 1/2005 | Yoshikawa et al. | |
| 6,875,914 B2 | 4/2005 | Guha et al. | |
| 7,053,775 B2 | 5/2006 | Moore | |
| 7,387,537 B1 * | 6/2008 | Daily et al. | 439/620.22 |
| 7,500,880 B1 * | 3/2009 | Vaziri et al. | 439/638 |
| 7,713,089 B2 | 5/2010 | Faust et al. | |
| 7,959,445 B1 * | 6/2011 | Daily et al. | 439/65 |
| 2002/0043031 A1 | 4/2002 | Eguchi et al. | |
| 2008/0115822 A1 | 5/2008 | Cunningham et al. | |
| 2008/0135088 A1 | 6/2008 | Corrales | |
| 2008/0190047 A1 | 8/2008 | Allen | |
| 2010/0180523 A1 | 7/2010 | Lena et al. | |

FOREIGN PATENT DOCUMENTS

| | | | |
|---|---|---|---|
| EP | 1923920 | 5/2008 | |
| WO | 9314525 A1 | 7/1993 | |
| WO | WO 9314525 A1 * | 7/1993 | H01L 31/05 |
| WO | 2008060509 A2 | 5/2008 | |
| WO | 2009/137348 | 11/2009 | |
| WO | 2009/137352 | 11/2009 | |
| WO | 2009/137353 | 11/2009 | |

* cited by examiner

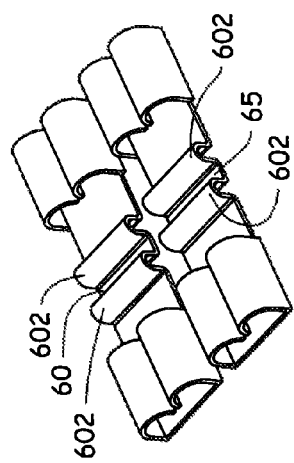
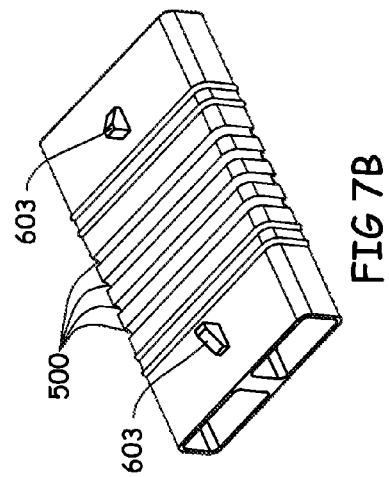
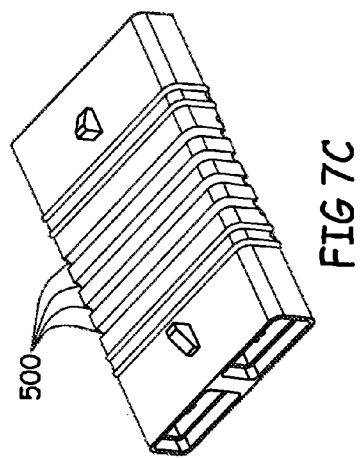

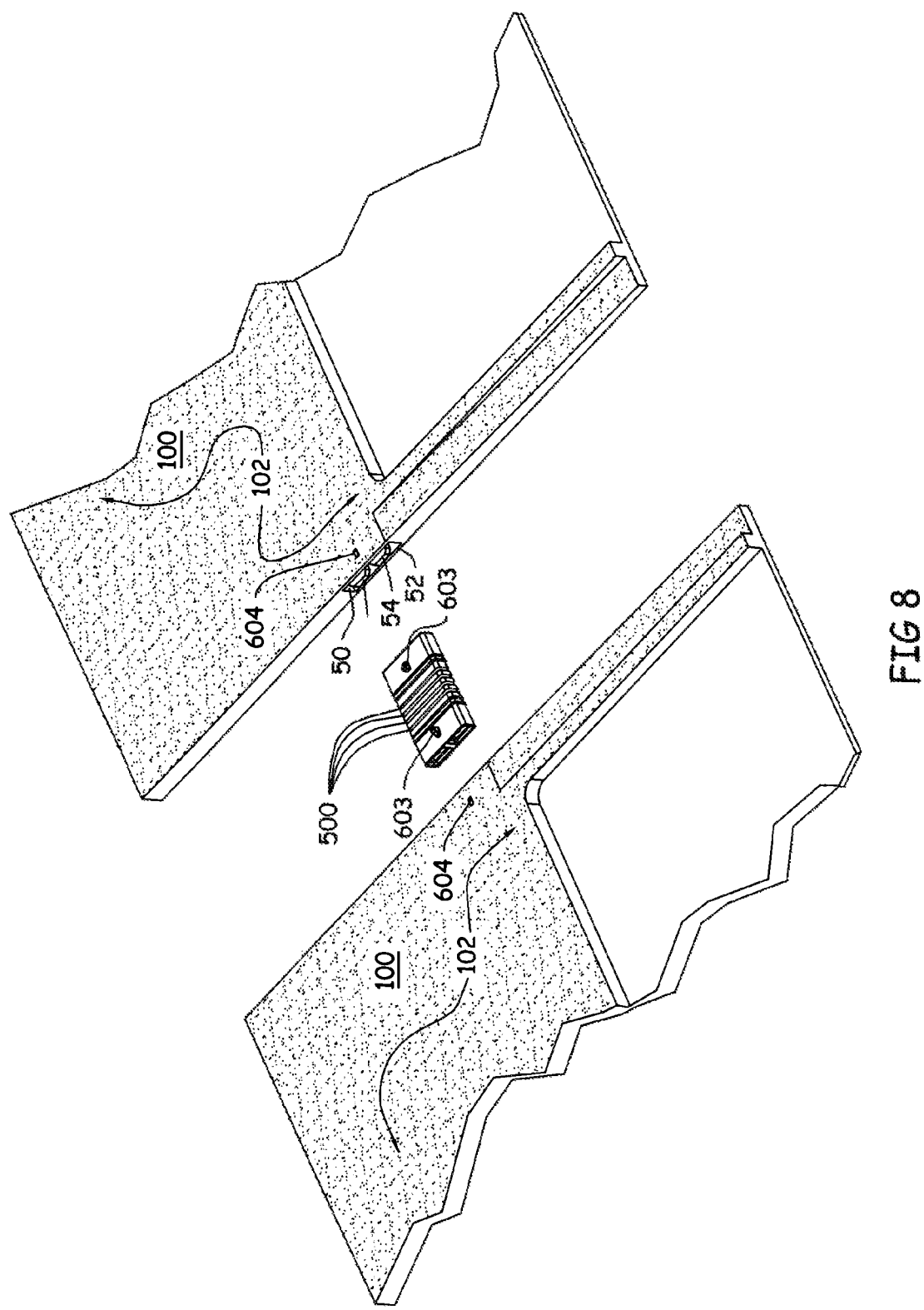

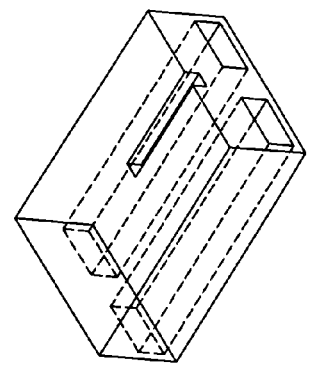
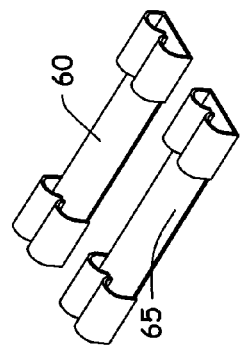
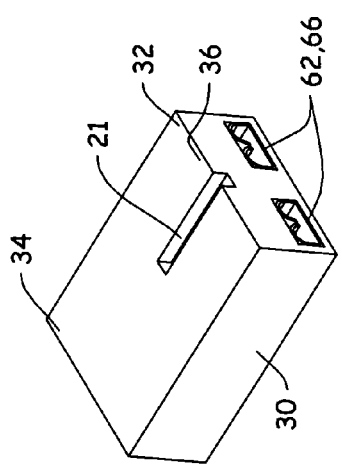
FIG 9A
FIG 9B
FIG 9C

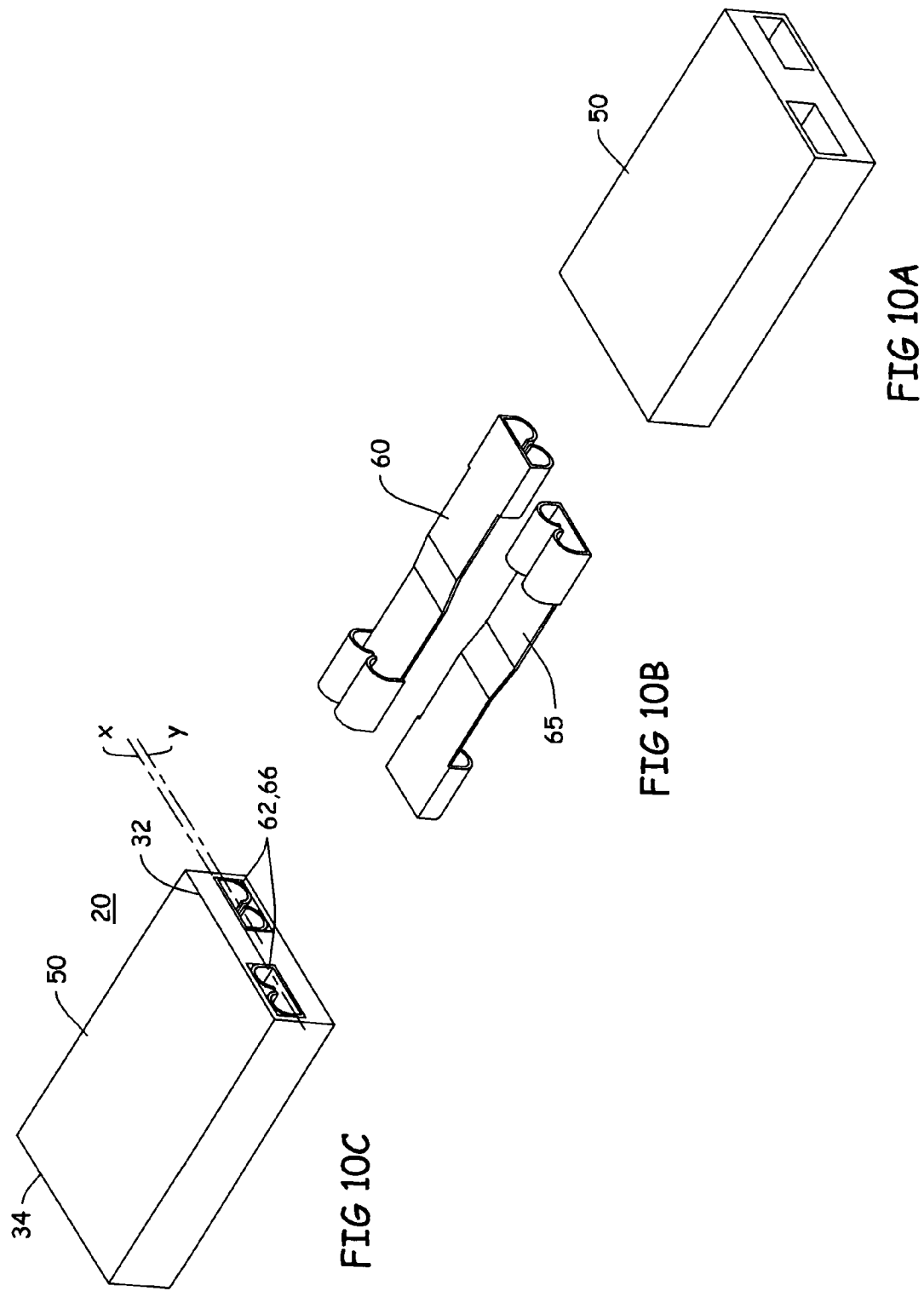

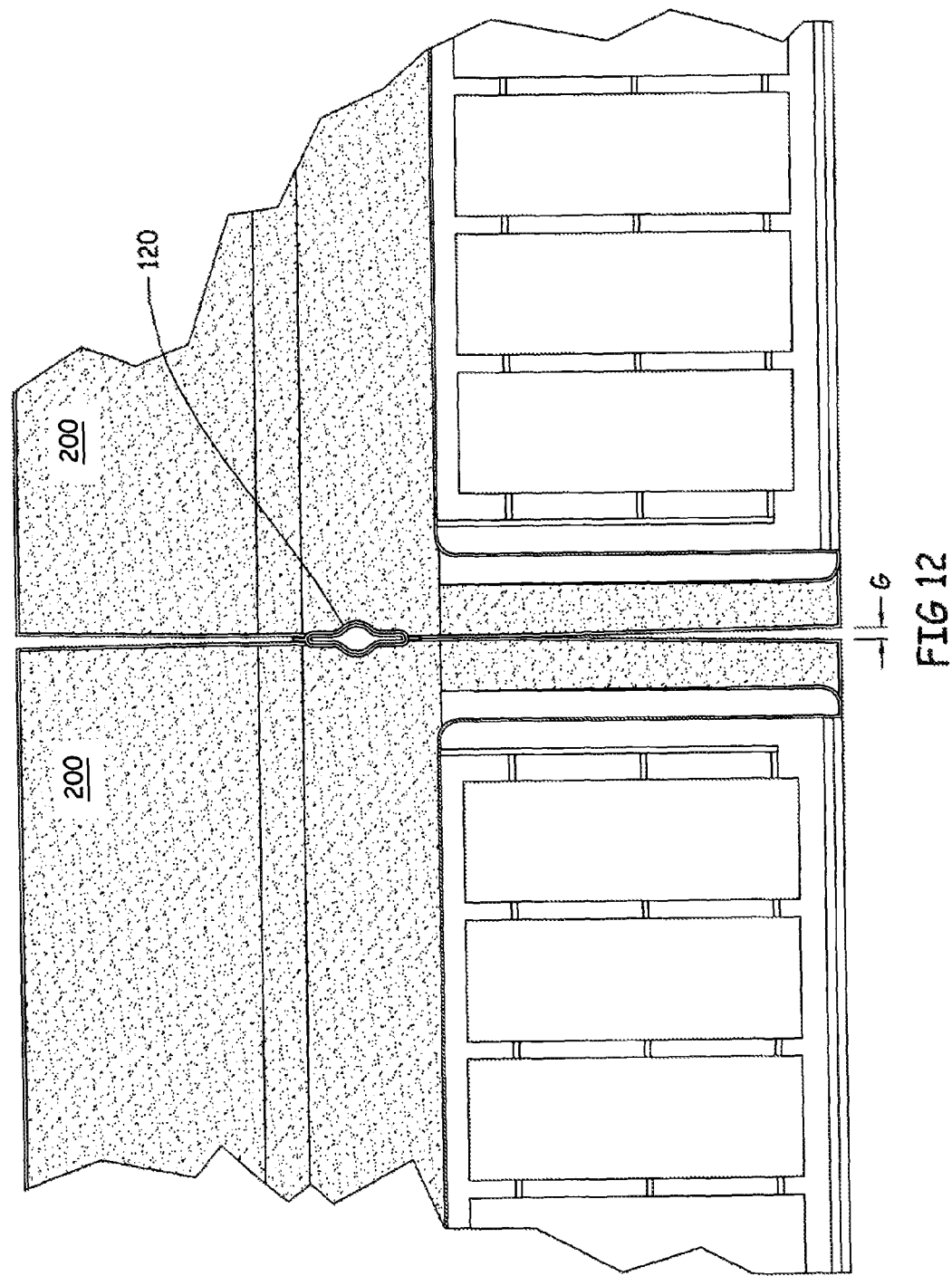

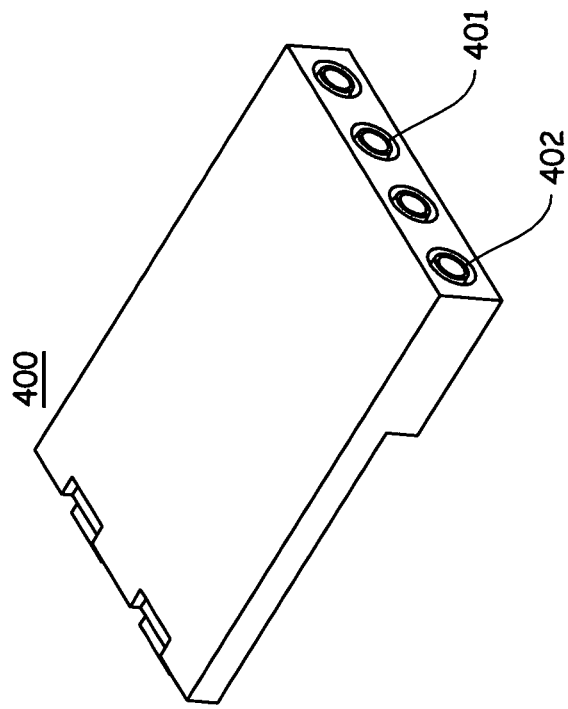
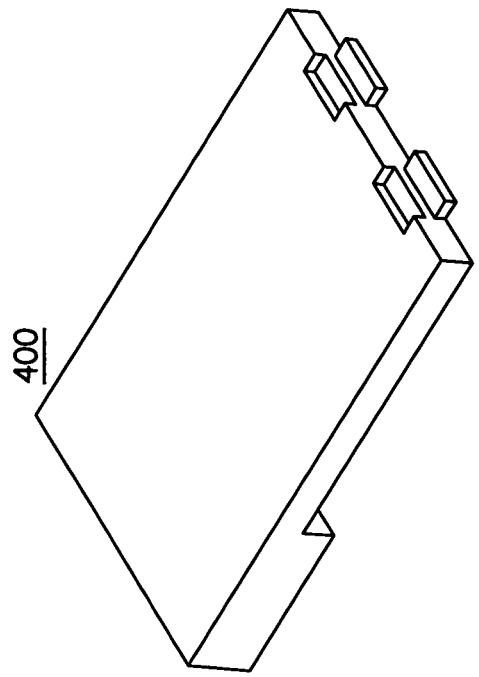
FIG 20

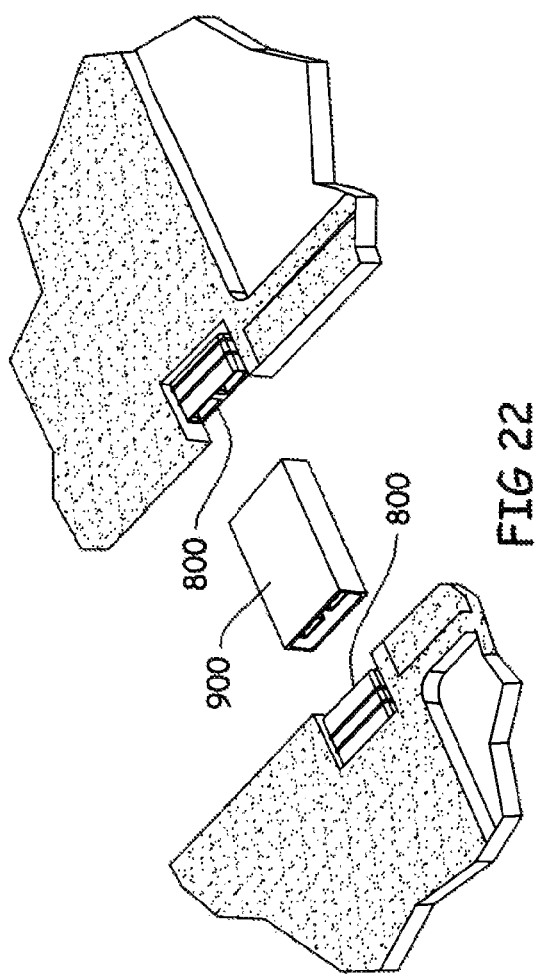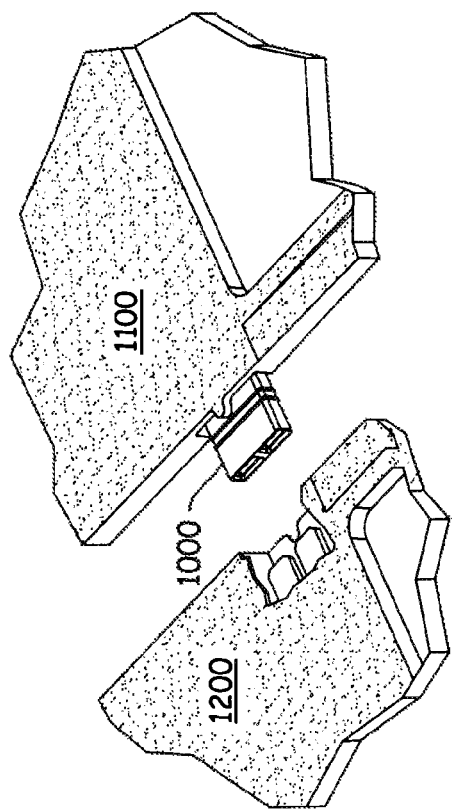

CONNECTOR DEVICE FOR BUILDING INTEGRATED PHOTOVOLTAIC DEVICE

CLAIM OF BENEFIT OF FILING DATE

The present application claims the benefit of the filing date of PCT Application Serial No. PCT/US2009/042492 (filed May 1, 2009) (Published as WO 2009/137347); U.S. Provisional Application Ser. No. 61/050,341 (filed May 5, 2008); U.S. Provisional Application Ser. No. 61/098,941 (filed Sep. 22, 2008); and U.S. Provisional Application Ser. No. 61/149,451 (filed Feb. 3, 2009) the contents of which are hereby incorporated by reference in their entirety.

This invention was made with U.S. Government support under contract DE-FC36-07G01754 awarded by the Department of Energy. The U.S. Government has certain rights in this invention.

FIELD OF THE INVENTION

The present invention relates to an improved connector, more particularly to an improved connector for a photovoltaic device.

BACKGROUND

Efforts to improve photovoltaic ("PV") systems, particularly to improve the connection, installation, and service of multiple devices are subject to continuing development within the PV industry. Of special interest are those PV systems that are integrated into building structures (e.g. roofing shingles, exterior wall coverings, or platforms). To aid in their commercial and functional viability, they should satisfy a number of criteria. The systems should be robust, that is they should be able to remain functional in a myriad of environmental conditions (e.g. heat, cold, wind, rain, snow, etc.). They should also not subject the building structure to overly adverse modifications due to their presence, such as multiple roof/wall penetrations made to electrically connect and/or locate the plurality of devices, resulting in the structure which may have to be subsequently sealed against leaks. The roof/wall penetrations and/or extensive wiring can make installation time consuming and expensive. Furthermore, when a system component (e.g. a single panel and/or a sub-component such as a bypass diode(s)) does become damaged or needs to be replaced, it may be valuable to have a connector that allows easy replacement of the PV system component or sub-component. Additionally, it may be desirous to provide a visual indication that the electrical circuit of the PV device is functional. Additionally, it may also be desirous that the overall thickness of the connector system be no greater than than the overall thickness of the PV devices which it is connecting. Additionally, it is preferable to provide these attributes in a small thickness consistent with a shingle or tile roof installation.

Among the literature that may pertain to this technology include the following patent documents:, U.S. Pat. Nos. 5,590,495; 5,986,203; 5,990,414; 6,840,799; 6,875,914; 7,053,775; 7,387,537; US2008/0135088; US2008/0115822; US 2008/0190047; EP1744372; EP1923920; WO2008/060509; U.S. Provisional Application Nos. 61/050,341 (filed 5 May 2008); 61/098,941 (filed 22 Sep. 2008); 61/149,451 (filed 3 Feb. 2009), and PCT Applications WO2009/137,348; WO2009/137353; and WO2009/137,352 filed concurrently with the present application, all incorporated herein by reference for all purposes.

SUMMARY OF THE INVENTION

The present invention is directed to a solution to at least one or more of the issues described above. Particularly, the present invention seeks to provide a robust connector device and method that can more easily electrically connect a plurality of photovoltaic "PV" devices and/or locate these devices upon a building structure. It also may optionally provide some additional components (e.g. a bypass diode(s) and/or an indicator means) and may enhance the serviceability of the device.

Accordingly, pursuant to a first aspect of the present invention, there is contemplated a photovoltaic device connector assembly for connecting and locating a photovoltaic device in which the assembly comprises a base portion including a first end portion, a second end portion, an intermediate portion and an outer surface; a locator portion located on the outer surface of the intermediate portion, the locator portion including a bearing wall that projects away from the outer surface and is shaped to generally complement an opposing connector housing in the photovoltaic device wherein the bearing wall and opposing connector housing (e.g. male "header" or female "receptacle") are rotationally adjustable relative to each other, (e.g. the bearing wall has an arcuate shape); and at least one electrically conductive member that is substantially surrounded by the base portion and that spans between the first and second end portions and includes connective terminals at opposing ends that are shaped to interlock with an opposing terminal in the opposing connector housing, so that the bearing wall partially contacts an opposing surface in the connector housing. Preferably, the opposing connector housing in the PV device is a receptacle connector housing. Preferably the connector has a thickness (T) that may range from as little as about 5 mm to as much as 20 mm or more and may vary in different areas of the body of the connector.

Accordingly, pursuant to a second aspect of the present invention, there is contemplated a photovoltaic device connector assembly for connecting and locating a photovoltaic device that comprises: a base portion including a first end portion, a second end portion and an outer surface; a locator portion located on the outer surface, the locator portion including a bearing wall shaped to generally complement an opposing receptacle connector housing in the photovoltaic device; and at least one electrically conductive member that is substantially surrounded by the base portion and that spans between the first and second end portions and includes connective terminals at opposing ends that are shaped to interlock with an opposing terminal in the opposing receptacle connector housing, so that the bearing wall at least partially contacts an opposing surface in the receptacle connector housing.

Accordingly, pursuant to a third aspect of the present invention, there is contemplated a photovoltaic device connector assembly for connecting and locating a plurality of photovoltaic devices comprising: a first receptacle connector housing and a second receptacle connector housing; at least one first locator portion located in a peripheral wall portion of the first receptacle connector housing; at least one second locator portion located in a peripheral wall portion of the second receptacle connector housing, the second locator portion geometrically complementary with the first locator portion; at least one receptacle electrical terminal at least partially encapsulated in each of the first and second receptacle connector housings; wherein the first receptacle connector housing is at least partially connectively disposed on a side portion of a first photovoltaic device and the second receptacle connector housing is at least partially connectively disposed on a side portion of a second photovoltaic device;

further wherein the first and second locater portions provide a rotationally adjustable location function between the first and second photovoltaic device; and a header connector element; at least a first and second header electrical terminals at least partially encapsulated in the header connector element, the first header electrical terminal geometrically complementary with the receptacle electrical terminal of the first receptacle connector housing and the second header electrical terminal geometrically complementary with the receptacle electrical terminal of the second receptacle connector housing, completing an electrical circuit therebetween.

The invention of the first through third aspect may be further characterized by one or any combination of the features described herein, such as the opposing receptacle connector housing is integral to an outer wall section of the photovoltaic device; the connector assembly includes at least one bypass diode electrically connected to the at least one electrically conductive member; the connector includes an indicator device to communicate a circuit status; a locking device that locks the header connector element to the opposing receptacle connector housing upon installation; the opposing connector housing in a photovoltaic device includes a strain relief feature; the connector assembly includes a second electrically conductive member, the first end portion is integral to the outer wall section of the photovoltaic device, the connector element (header or receptacle) is integral to the first connector housing (header or receptacle), an outwardly projecting portion in the locator portion that projects upward towards a top surface that is generally coplanar with a top surface of the photovoltaic device.

Accordingly, pursuant to a fourth aspect of the present invention, there is contemplated a method of locating and electrically connecting a plurality of photovoltaic devices together comprising the steps of: a. providing a first photovoltaic device with a first connector housing (e.g. header or receptacle) located on a side portion of the device, the connector housing including at least one first electrical connector terminal and at least one first locator feature; b. providing at least a second photovoltaic device with a second connector housing (e.g. header or receptacle) located on a side portion of the device, the second connector housing including at least one second electrical connector terminal and at least one second locator feature; c. providing a connector according to any of the proceeding aspects described above which is complementary to the connector housings; joining one end of the connector to the first connector housing; joining the opposing end of the header connector to the second connector housing; rotationally locating the first and second photovoltaic devices to each other via the bearing wall of the connector; and g. repeating steps c-f for each of the plurality of photovoltaic devices.

Accordingly, pursuant to a fifth aspect of the present invention, there is contemplated a method of locating and electrically connecting a plurality of photovoltaic devices together comprising the steps of: a. providing a first photovoltaic device with a first receptacle connector housing located on a side portion of the device, the receptacle connector housing including at least one first electrical connector terminal and at least one first locator feature; providing at least a second photovoltaic device with a second receptacle connector housing located on a side portion of the device, the second receptacle connector housing including at least one second electrical connector terminal and at least one second locator feature, wherein the first receptacle connector housing is at least partially connectively disposed on a side portion of a first photovoltaic device and the second receptacle connector housing is at least partially connectively disposed on a side portion of a second photovoltaic device, further wherein the first and second locater portions provide a rotationally adjustable location function between the first and second photovoltaic device; b. providing a header connector according to the third aspect described above; c. rotationally locating the first and second photovoltaic devices to each other via the first and second locater portions; d. joining header connector element to the first and second receptacle connector housing; and e. repeating steps c-d for each of the plurality of photovoltaic devices.

It is also should be appreciated that the present invention contemplates a PV device assembly comprising a plurality of PV devices connected by the connector assemblies of any of the aspects described above or subsequently in this application. Furthermore, it is contemplated that the photovoltaic device connector assembly according to the present invention is preferably no greater in thickness than the overall thickness of the PV devices which it is connecting (e.g. preferably less than about 15 mm, more preferably less than about 12 mm).

It should be appreciated that the above referenced aspects and examples are non-limiting, as others exist within the present invention, as shown and described herein.

DESCRIPTION OF THE DRAWINGS

FIGS. 7A, B are an exemplary illustration of an exploded view of another strain relief embodiment according to the present invention.

FIG. 7C is the assembled connector of FIGS. 7A and B.

FIG. 8 is an exemplary illustration of the device of FIG. 7C with PV devices shown according to the present invention.

FIGS. 9A-B are an exemplary illustration of an exploded view of one keying embodiment according to the present invention.

FIG. 9C is the assembled connector of FIGS. 9A and B.

FIGS. 10A, B are an exemplary illustration of an exploded view of another keying embodiment according to the present invention.

FIG. 10C is the assembled connector of FIGS. 10A and B.

FIG. 12 is an exemplary illustration of an assembled view of another embodiment according to the present invention.

FIG. 20 is an exemplary illustration of two perspective views of the header connector of FIG. 19 according to the present invention.

FIG. 22 is another exemplary illustration of an exploded view of one embodiment according to the present invention.

FIG. 23 is another exemplary illustration of an exploded view with a cut-away section on one PV device of one embodiment according to the present invention.

DETAILED DESCRIPTION OF THE PREFERRED EMBODIMENT

The present invention is a connector assembly system for connecting PV devices or components of a PV system/kit (e.g. PV devices, edge pieces, spacer pieces, or any combination thereof) together. This includes the functions of both electrically connecting the devices, as well as locating them to one another. Preferably, the system also provides at least some rotational adjustability between the devices. For the sake of brevity, the description below refers mostly to "PV devices", but it should be realized that the connector assembly system is contemplated for and impliedly used to connect the other components of the PV system.

Generally, the materials contemplated for each of the components described below are appropriate for the given functions. For example, the housings and elements described forthwith preferably are comprised of somewhat rigid materials that will hold up to the conditions of use. The use of plastics (thermoplastics and thermosets), metals, ceramics, and composites are contemplated. Not surprisingly, the housings and elements structures will preferably be constructed of electrically non-conductive materials and the electrical members and terminals of electrically conductive materials. Preferred non-conductive materials may be organic or inorganic materials. Examples of preferred polymeric materials include thermoplastic and thermosetting materials such as, for example, filled or unfilled olefins, styrenics, polypropylene, polycarbonate, acrylonitrile butadiene styrene, nylon, polymeric elastomers, natural or synthetic rubber, ceramic, or any combination thereof. Preferred conductive materials include plated or un-plated metals (e.g. silver, tin, steel, gold, aluminum, or any combination thereof) and/or conductive polymers.

As a general statement, the photovoltaic device connector assembly 20 discussed throughout this application includes a receptacle housing on the photovoltaic devices and a header connector spanning therebetween. It is contemplated that scheme may be reversed or modified, that is the component attached to the PV devices may be the receptacle portion, the header portion or any combination thereof. As an example of this reversed scheme shown in FIG. 22, the header portion 800 is on the PV devices and the receptacle portion 900 connects the system. As another general statement, the positional adjustability of the PV devices that the present invention provides, as discussed in the paragraphs below, may be provided by geometric features of the connector system, the strain relief features of the system, or a combination of both.

Figure 1:
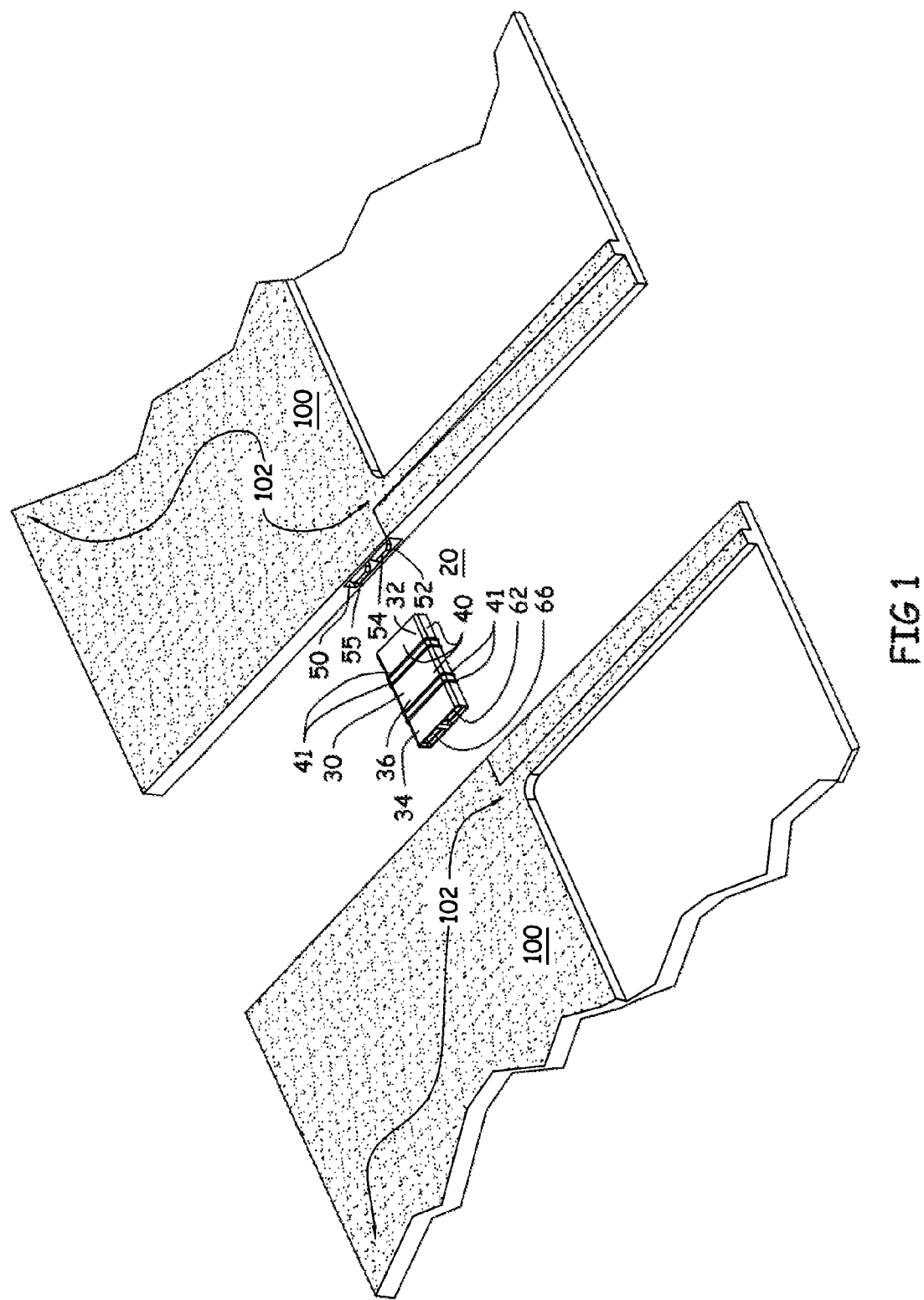
FIG. 1 is an exemplary illustration of an exploded view of one embodiment according to the present invention.
Figure 2:
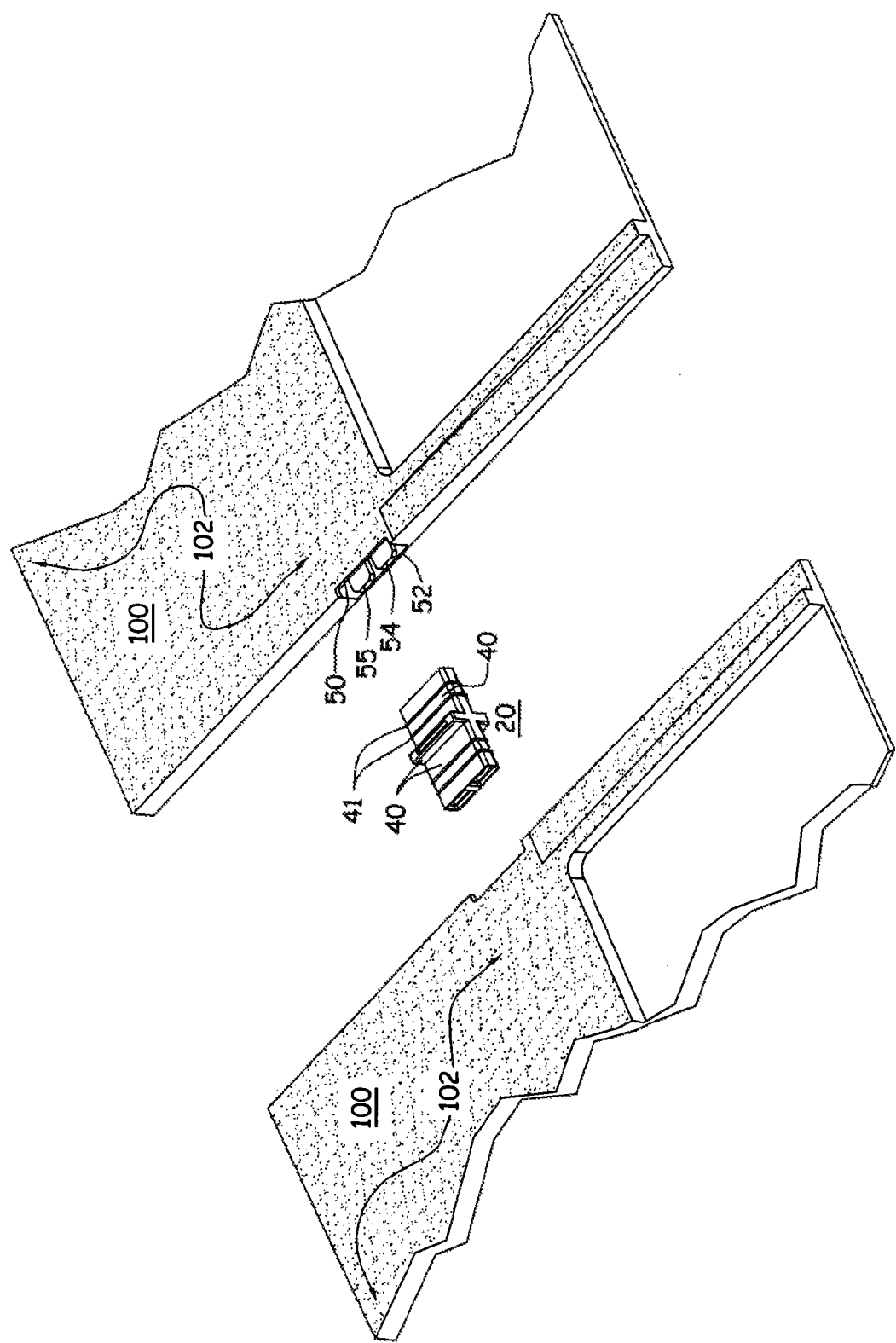
FIG. 2 is another exemplary illustration of an exploded view of one embodiment according to the present invention.
Figure 3:
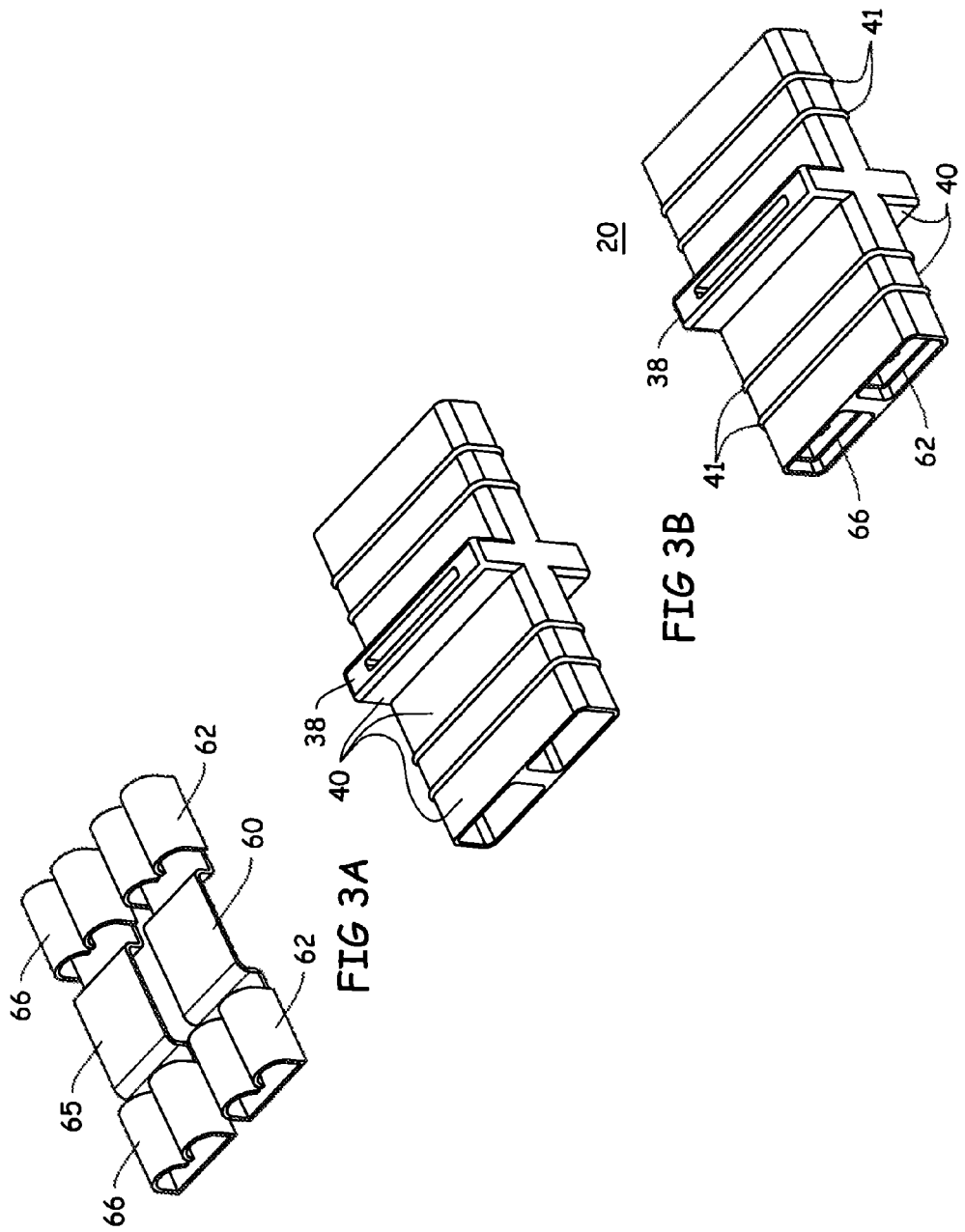
FIG. 3A-B are an exemplary illustration of an exploded view of the header connector of one embodiment according to the present invention.
FIG. 3C is the assembled connector of FIGS. 3A and B.
Figure 4:
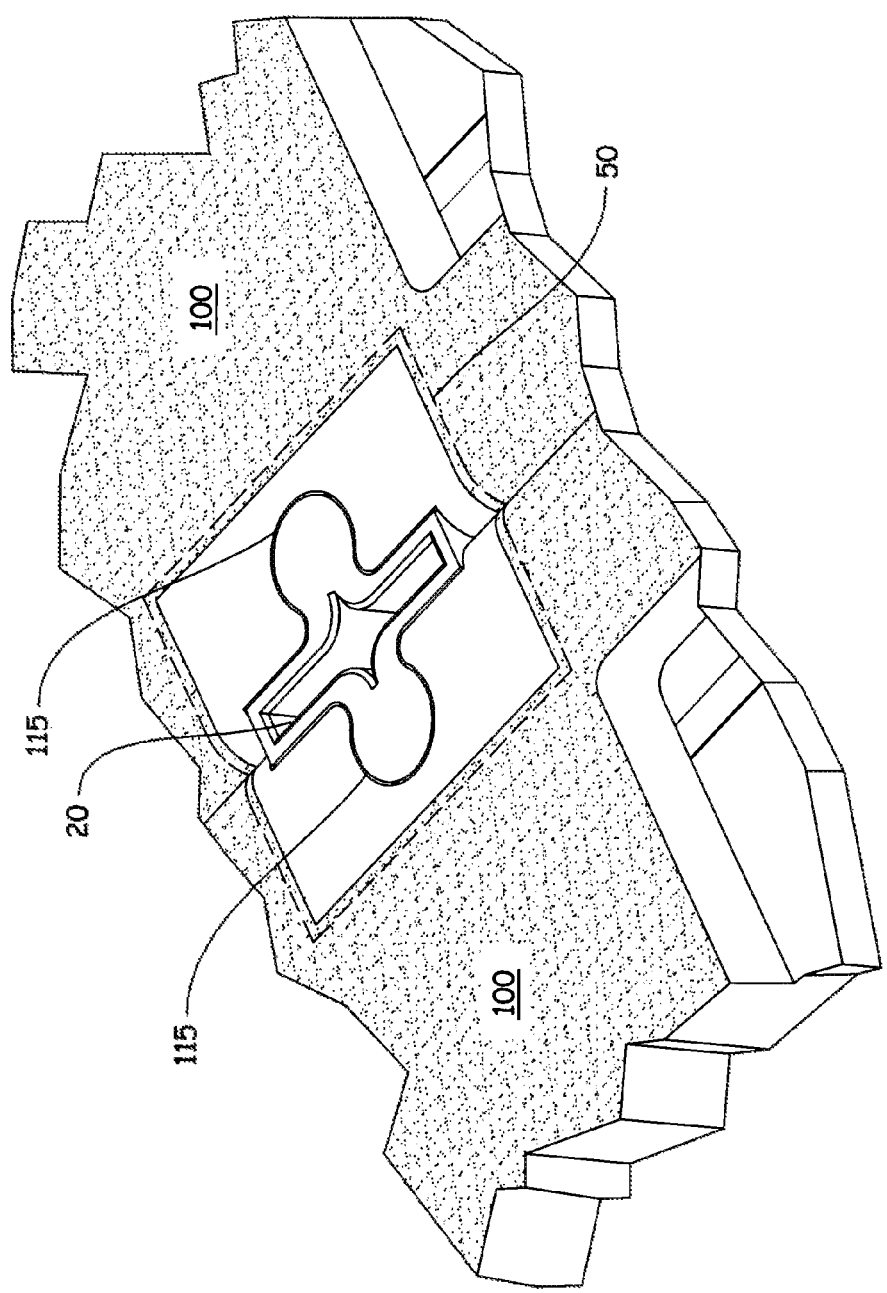
FIG. 4 is an exemplary illustration of an assembled view of one embodiment according to the present invention.

Referring to FIGS. 1, 2 and 3, in a first embodiment (referred to as the "second aspect" in the summary of the invention above), a photovoltaic device connector assembly 20 according to the present invention may be described generally as including a base portion 30 including a first end portion 32, a second end portion 34 and an outer surface 36. It also may include a locator portion 38 located on the outer surface 36. The locator portion 38 may be further described as including a bearing wall 40 that may be shaped to generally complement an opposing receptacle connector housing 50 that may be located in a photovoltaic device 100. Furthermore, upon installation, the bearing wall 40 may at least partially contact an opposing surface 52 in the receptacle connector housing 50. Moreover, the connector assembly may include at least one (or more) electrically conductive member 60 that is substantially surrounded by the base portion 30 and that spans between the first and second end portions 32, 34 and includes connective terminals 62 at opposing ends. These terminals 62 may be shaped to interlock with opposing terminals 54, 55 in the opposing receptacle connector housing 50. As shown in all the Figures, the connector assembly 20 and the receptacle connector housing 50 include two conductive members 60, 65 and two opposing terminals 54, 55.

Figure 21:
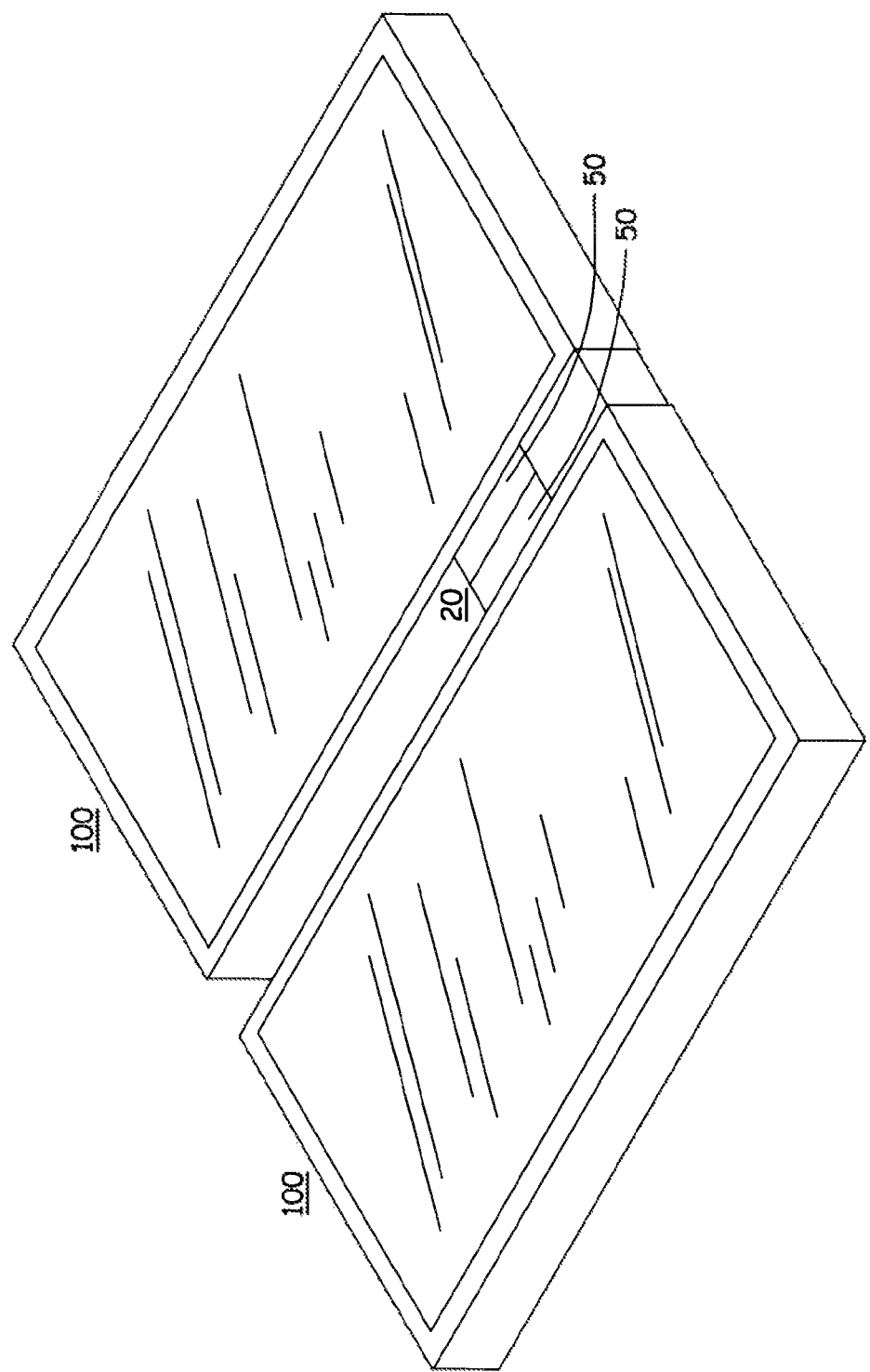
FIG. 21 is another exemplary illustration of an exploded view of one embodiment according to the present invention.

It is also contemplated that the opposing receptacle connector housing 50 may be integral to an outer wall section 102 (e.g. portions such as top, bottom, or sides of the PV device) of the photovoltaic device 100. The housing 50 may be connected to the device 100 via a fastener scheme (e.g. mechanical fasteners, adhesives, or a combination thereof) or may be integrated into the device 100 via the structure of the device 100 (e.g. over-molded into the device or part of the framework of the device). In either case, it is contemplated that receptacle connector housing 50 integral to or connected to (e.g. the housing sitting outside of the device as shown in FIG. 21) a photovoltaic device 100 and/or the connector assembly 20 includes a strain relief feature (or combination of one or more features) to allow movement of the assembly while maintaining an electrical contact between the respective terminals 54, 62.

Figure 5:
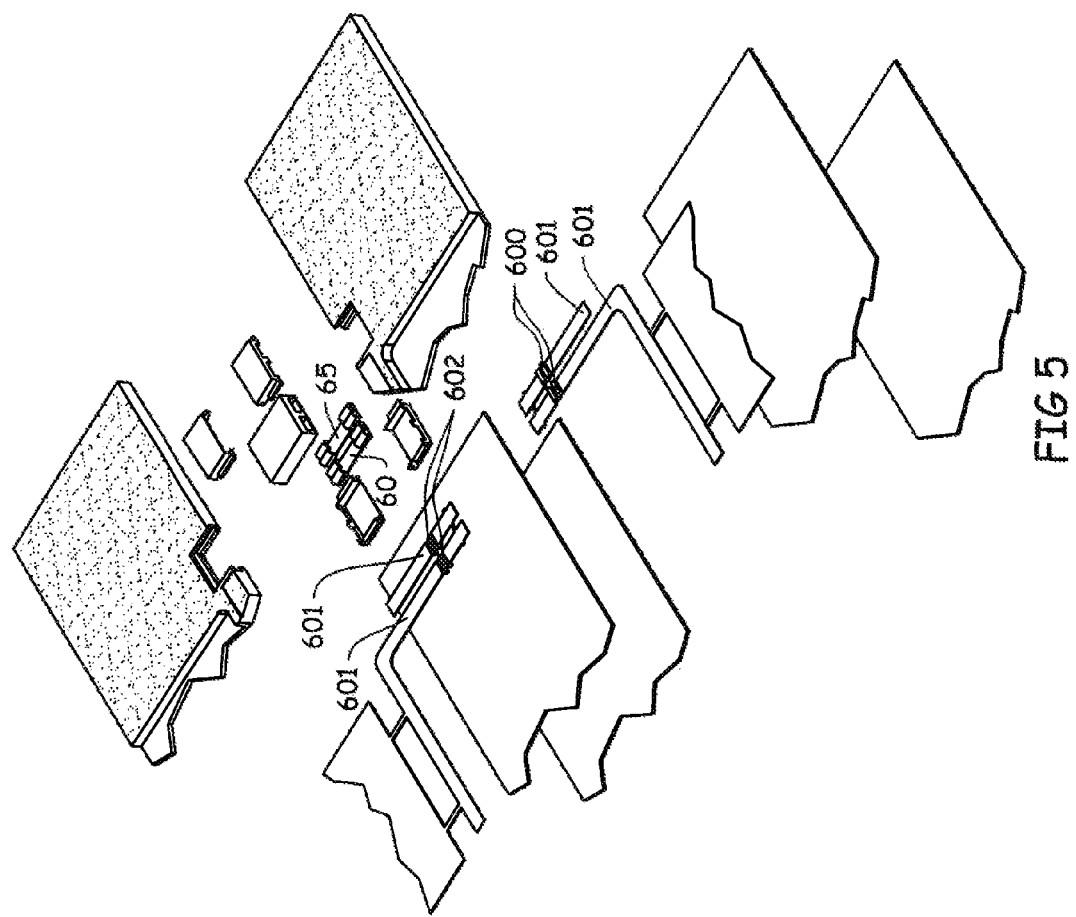
FIG. 5 is an exemplary illustration of an exploded view of one strain relief embodiment according to the present invention.
Figure 6:
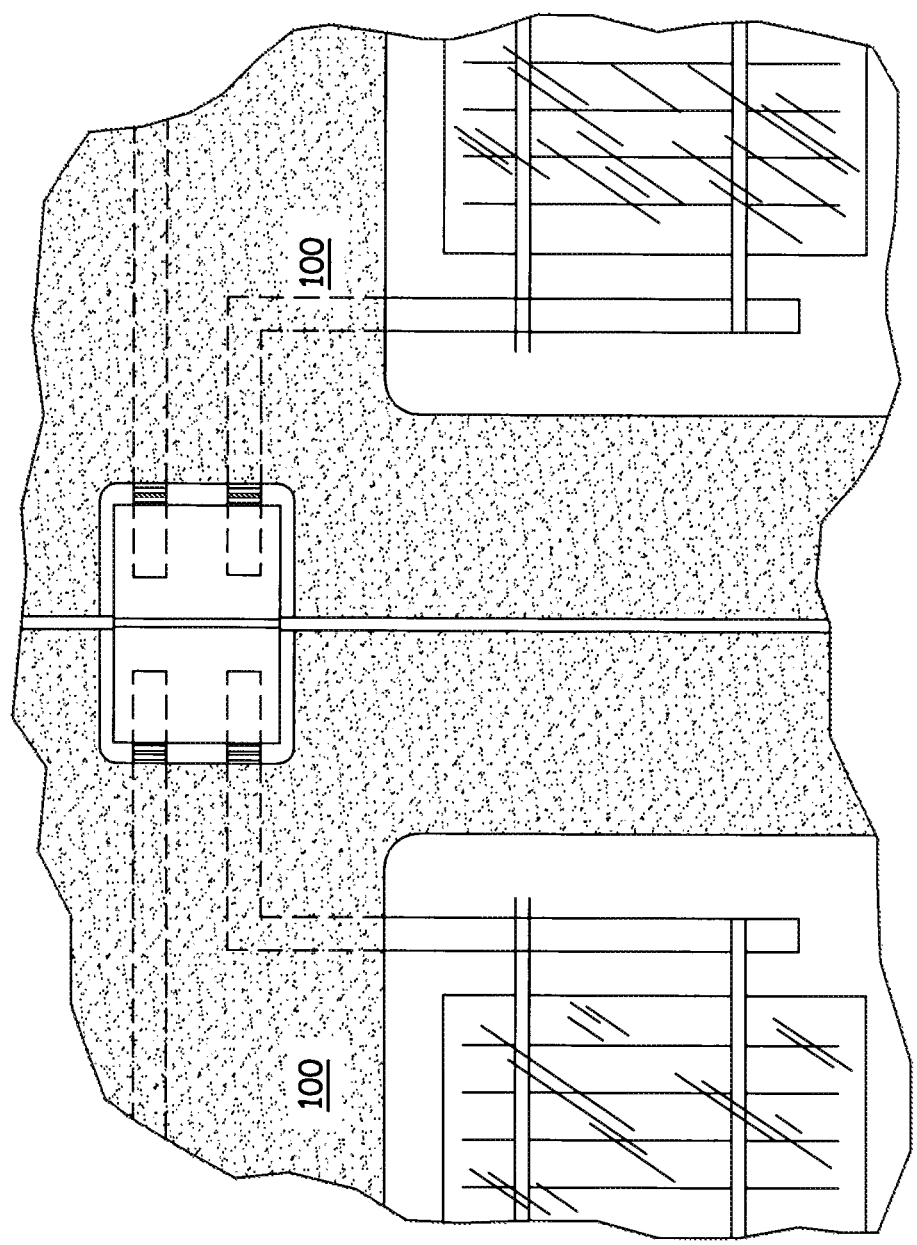
FIG. 6 is an exemplary illustration of an assembled top view of FIG. 5 according to the present invention.

One type of strain relief feature, as shown in FIG. 7, may include indentations 500 in the connector (as shown) or the receptacle housing (not shown) for high flex regions. It also may include the use of low modulus materials within or around the connector or the receptacle housing. Another strain relief feature, as shown in FIGS. 5, 7, and 8, may include undulations 600, 602 in the electrically conductive member 60, 65 of the header side, in the electrically conductive member 601 of the receptacle side, or both. Also shown in FIGS. 7-8 is an optional pair of locking tabs 603 (e.g. triangular projections or the like), with a mating feature or mating hole 604 in the PV device. It is preferred that these locking tabs be in the vicinity (e.g. within about 15 mm) of the area where the respective terminals connect.

Figure 11A:
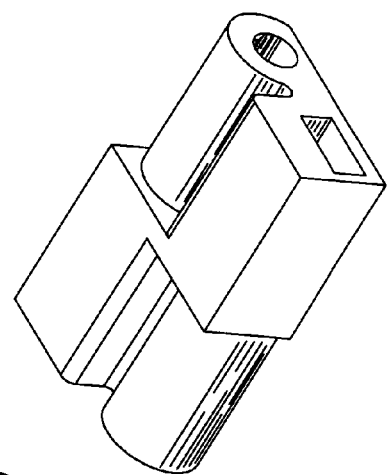
FIGS. 11A, B are an exemplary illustration of an exploded view of yet another keying embodiment according to the present invention.
Figure 11B:
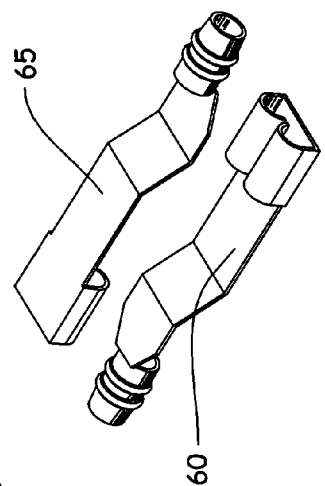
FIG. 11C is the assembled connector of FIGS. 11A and B.
Figure 11C:
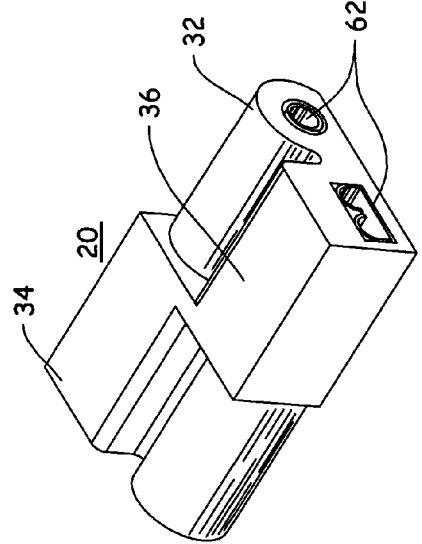
Figure 13:
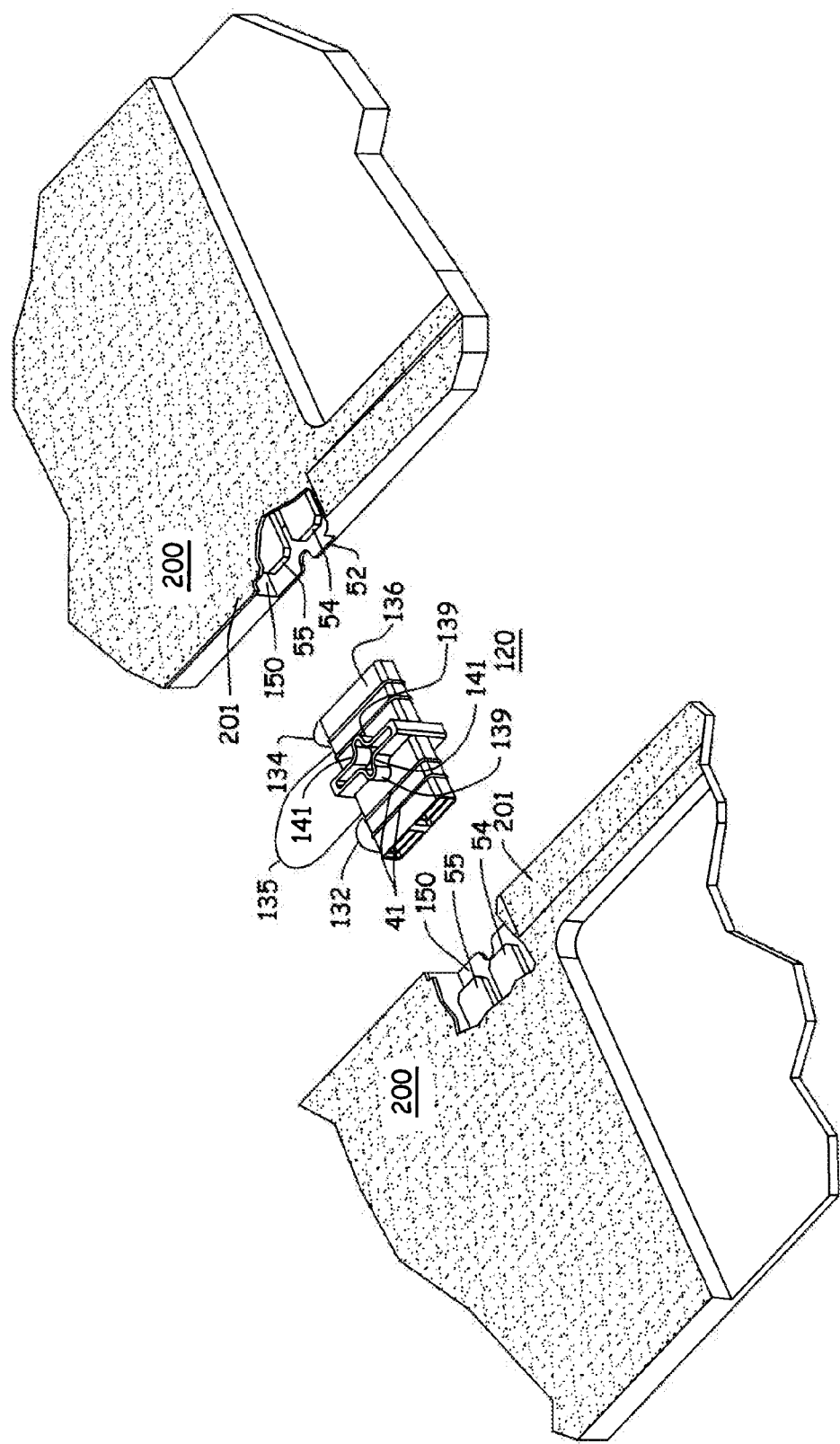
FIG. 13 is an exemplary illustration of an exploded assembly view with cut away sections of the receptacle housing according to the present invention.
Figure 14B:
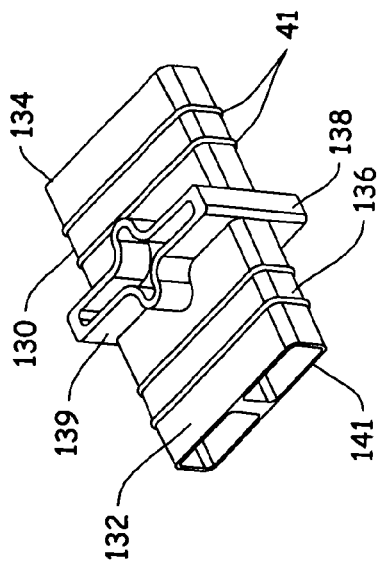
FIGS. 14A, B is an exemplary illustration of an exploded view of the connector component of FIG. 13. according to the present invention.
FIG. 14C is the assembled connector of FIGS. 14A and B.
Figure 14A:
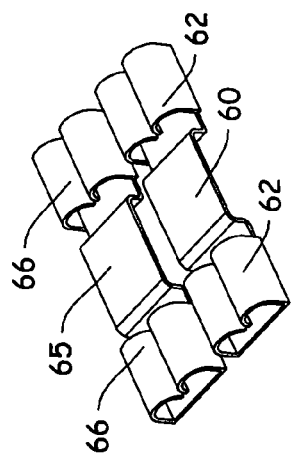
Figure 14C:
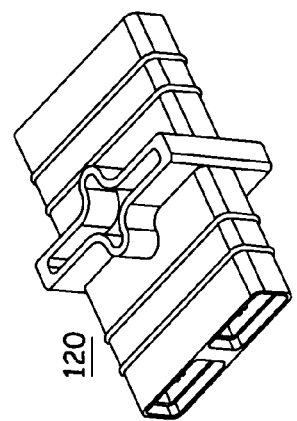

It is also contemplated that the photovoltaic device connector assembly 20 may be "keyed" so that the PV devices and the connector assembly 20 may be assembled in only one way. A number of keying features or combinations of features may be employed, with examples shown in FIGS. 9-11, which are illustrative examples and should not be considered as limiting. In FIG. 9, a slot 21 is placed on one side of the connector assembly 20, with a matching projection (not shown) in the receptacle housing 50. In FIG. 10, the terminals 62, 66 are inverted relative to each other so that the mating terminals in the receptacle housing 50 only fit one way. In FIG. 11 the outer surface 36 is asymmetrical and the terminals 62, 66 are of different types.

Figure 15:
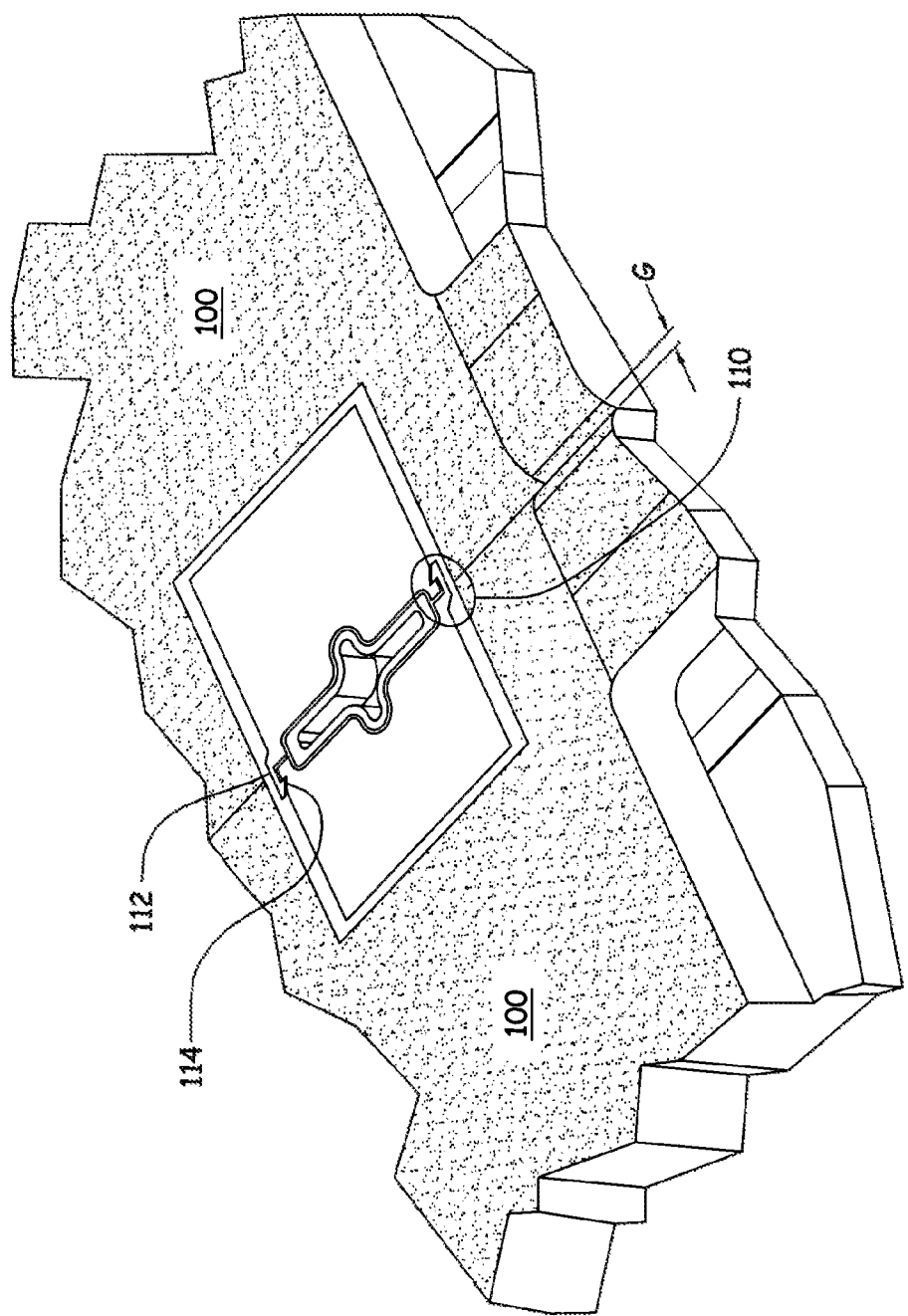
FIG. 15 is an exemplary illustration of an assembly view including a possible locking feature of one embodiment according to the present invention.

The connector assembly 20 may also include a locking device 110 or a means to accept a locking device so that the connector assembly 20 and the opposing receptacle connector housing 50 stay secure upon installation. One illustrative example of such a locking device, shown in FIG. 15, is a simple projection feature 112 on one or more sides and a complimentary detent feature 114 on the other. Another illustrative example, shown in FIG. 3, uses a locking feature 115 in the area of the locating portion 38.

It is contemplated that the connector assembly 20 may also include sealing features, for example as shown as raised semi-circles 41 in the figures. These sealing features may be integral to the connector (e.g. formed within) or be separate pieces (e.g. gaskets or o-rings) placed upon the connector for installation.

Figure 17:
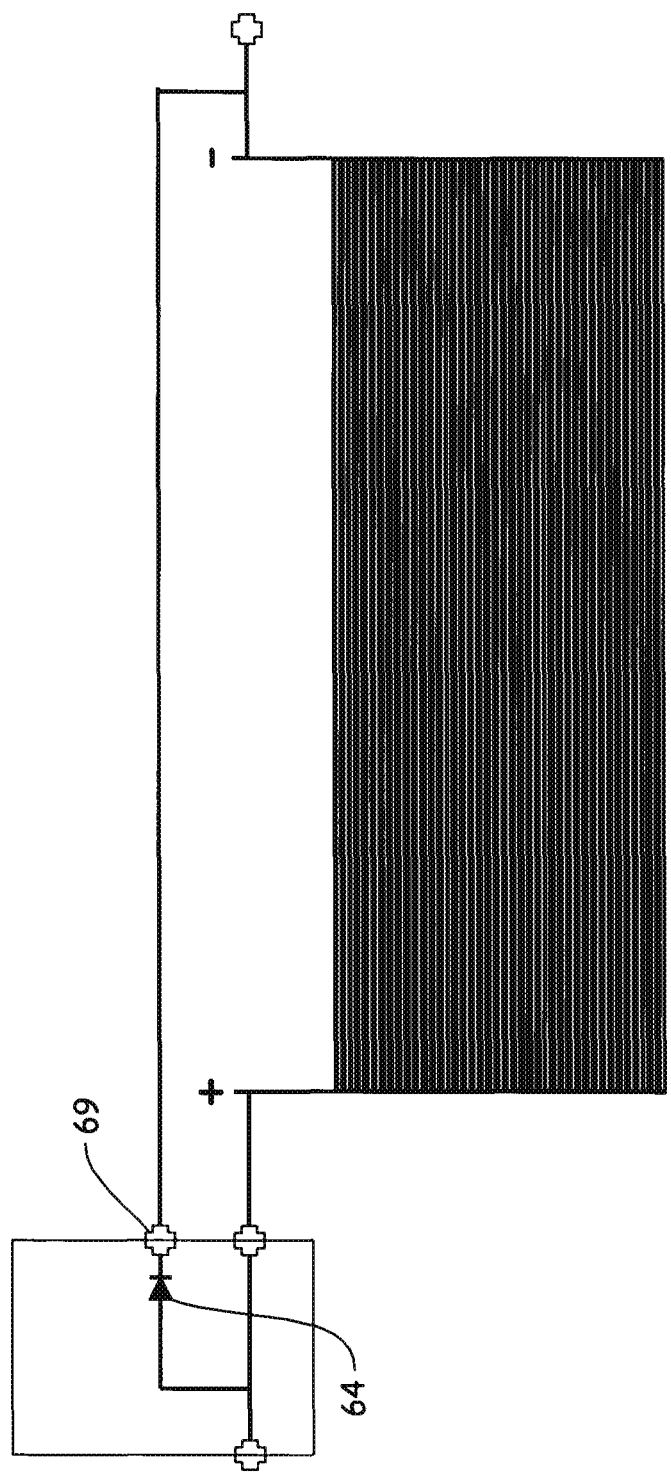
FIG. 17 is an exemplary illustration of a schematic of one embodiment according to the present invention.

It is contemplated that the connector may include at least one bypass diode 64 (e.g. a diode connected to allow current to pass only in the desired direction with respect to the PV device) that is electrically connected to the at least one electrically conductive member 60 on one end and to a possible third terminal 69. One possible schematic view of a bypass diode 64 is shown in FIG. 17. The bypass diode 64 functions to allow current flow through the circuit when the PV device 100 is inactive (e.g. not producing current). Advantageously, by placing this bypass function into the connector assembly 20, this component may now be easily replaced in the event that it fails, without replacing the entire PV device 100.

Figure 16:
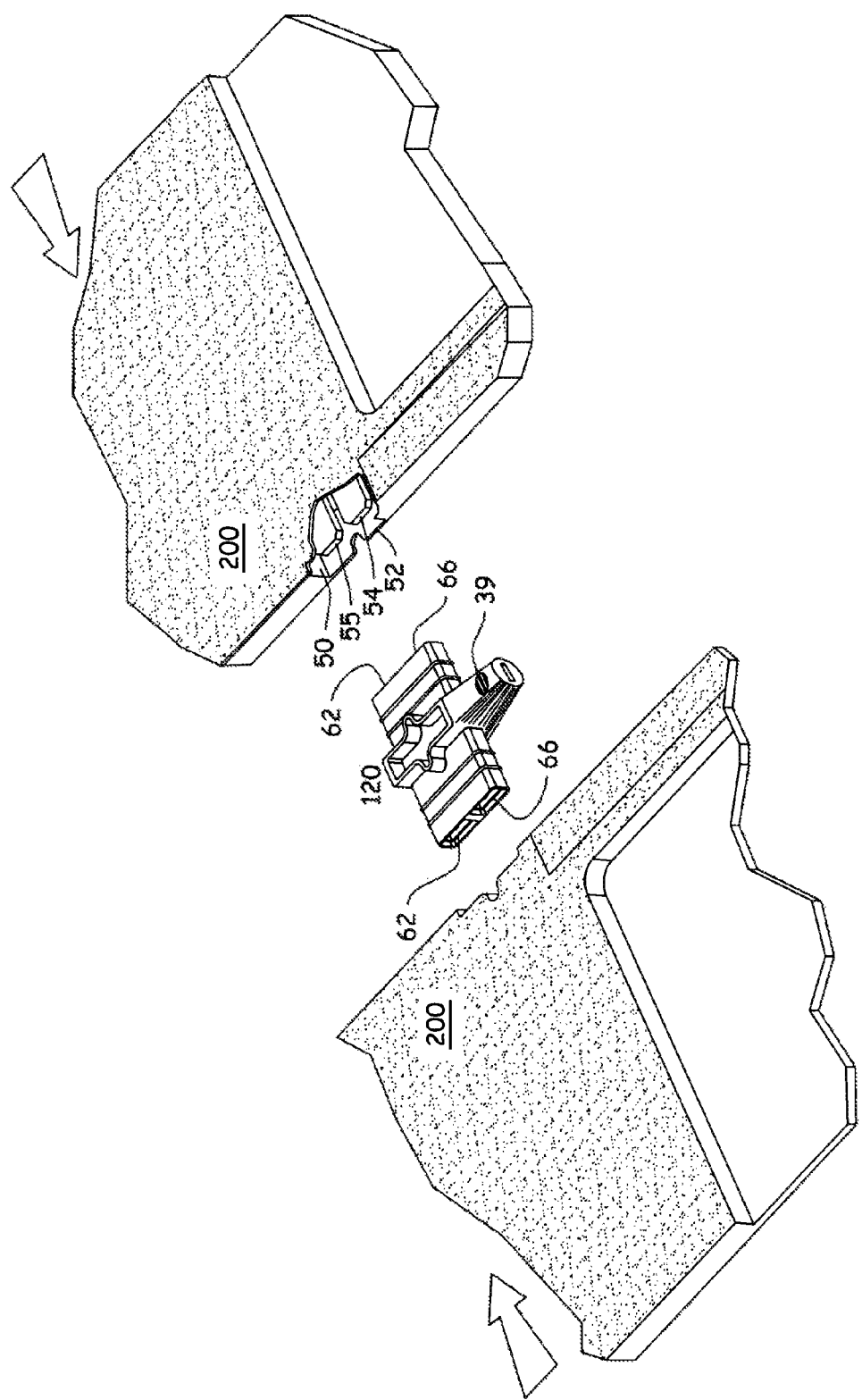
FIG. 16 is an exemplary illustration of an exploded view of one embodiment according to the present invention including an exemplary status indicator.

In another aspect of the present invention, the connector assembly 20, the receptacle connector housing 50 or both may include a signaling device 39 (e.g. as shown in FIG. 16) to communicate a circuit status (e.g. current is flowing or not flowing), such as a light emitting diode "LED" or mechanical pop-up button. Preferably, this signaling device 39 would project downward from the base portion 30, so that it may be visible in the event that the connector assembly 20 is covered. It is also contemplated that a fuse, circuit breaker or other like devices may be included therein. A circuit breaker may include a reed switch, which is an electrical switch operated by an applied magnetic field, as illustrated in U.S. Pat. No. 2,264,746. Furthermore, the connector assembly 20 may include a second electrically conductive member 65 that also spans the connector 20 and mates via terminals 66, to terminals in the receptacle connector housing 50. This secondary electrical conductive member 65 may function as what may be called a "home run wire", that provides a return path for the electric current of a single or multiple PV devices 100. There may also be additional electrically conductive members and terminals depending on any additional circuitry included in the assembly 20 (e.g. a third conductive path for the by-pass diode 64) Additionally, it is also preferred that the overall thickness of the connector system be no greater than the overall thickness of the PV devices 100 which it is connecting.

Referring to FIGS. 12 through 16, an illustrative example of a second embodiment of the present invention is shown (referred to as the "first aspect" in the summary of the invention above). This second embodiment shares most or all of the features of the first embodiment described above, with the differences described in detail below.

Again, referring to FIGS. 12 though 16, a photovoltaic device connector assembly 120 according to the present invention may be described generally as including a base portion 130 including a first end portion 132, a second end portion 134, an intermediate portion 135 and an outer surface 136. It can include an outwardly projecting locator portion 138 located on the outer surface 136 of the intermediate portion 135. The outwardly projecting locator portion 138 includes an element which is rotationally adjustable relative to an opposing receptacle connector housing 150. The element preferably is an arcuate bearing wall 139 that projects away from the outer surface 136. It may be shaped to generally complement an opposing receptacle connector housing 150 in the photovoltaic device 200. Moreover, the connector assembly 120 may include at least one electrically conductive member 60 that is substantially surrounded by the base portion 130 and that spans between the first and second end portions 132, 134 and includes connective terminals 62 at opposing ends. These terminals 62 may be shaped to interlock with an opposing terminal 54 in the opposing receptacle connector housing 150.

As in the first embodiment, it is also contemplated that the opposing receptacle connector housing 150 may be integral to an outer wall section 102 of the photovoltaic device 200. Also, the connector may include at least one bypass diode 64, a signaling device 39, and/or a second electrically conductive member 65.

The outwardly projecting locator portion 138 may be further described as projecting away from the outer surface 136 upward and/or downward towards a surface of the device 200. Preferably, projecting towards at least a top surface 201 of the device 200 and it is generally coplanar with the top surface 201, although it may be sub-flush or over-flush to the top surface 201.

It is contemplated that the arcuate bearing wall 139 of the outwardly projecting locator portion 138 functions to locate both the connector assembly 120 and at least two opposing receptacle connector housings 150. This in turn functions to help locate the opposing PV devices 200. The arcuate shape of the bearing wall 139 along with the strain relief feature mentioned previously and the complementary shape of the receptacle housing 150, functions to allow a limited amount (e.g. up to 15°) of rotational adjustment between the devices 200. The bearing wall 139 may have a continuous or a segmented surface. The continuous surface may allow for an infinite rotational adjustment increments and the segmented surface (e.g. gear like) may allow for a finite adjustment increments.

It is also contemplated that the bearing wall 139 may include a plurality of gapping segments 141, that when the bearing wall 139 is in contact with the complementary shape of the receptacle housing 150, functions to provide a gap G between the PV devices 200. This gap G may vary depending upon the amount of rotational adjustment between the devices 200 and the length of the gapping segments 141. The gapping segments 141 preferably are at least about 0.5 mm long, more preferably about 5 mm or more, and most preferably about 10 mm or more.

Figure 18:
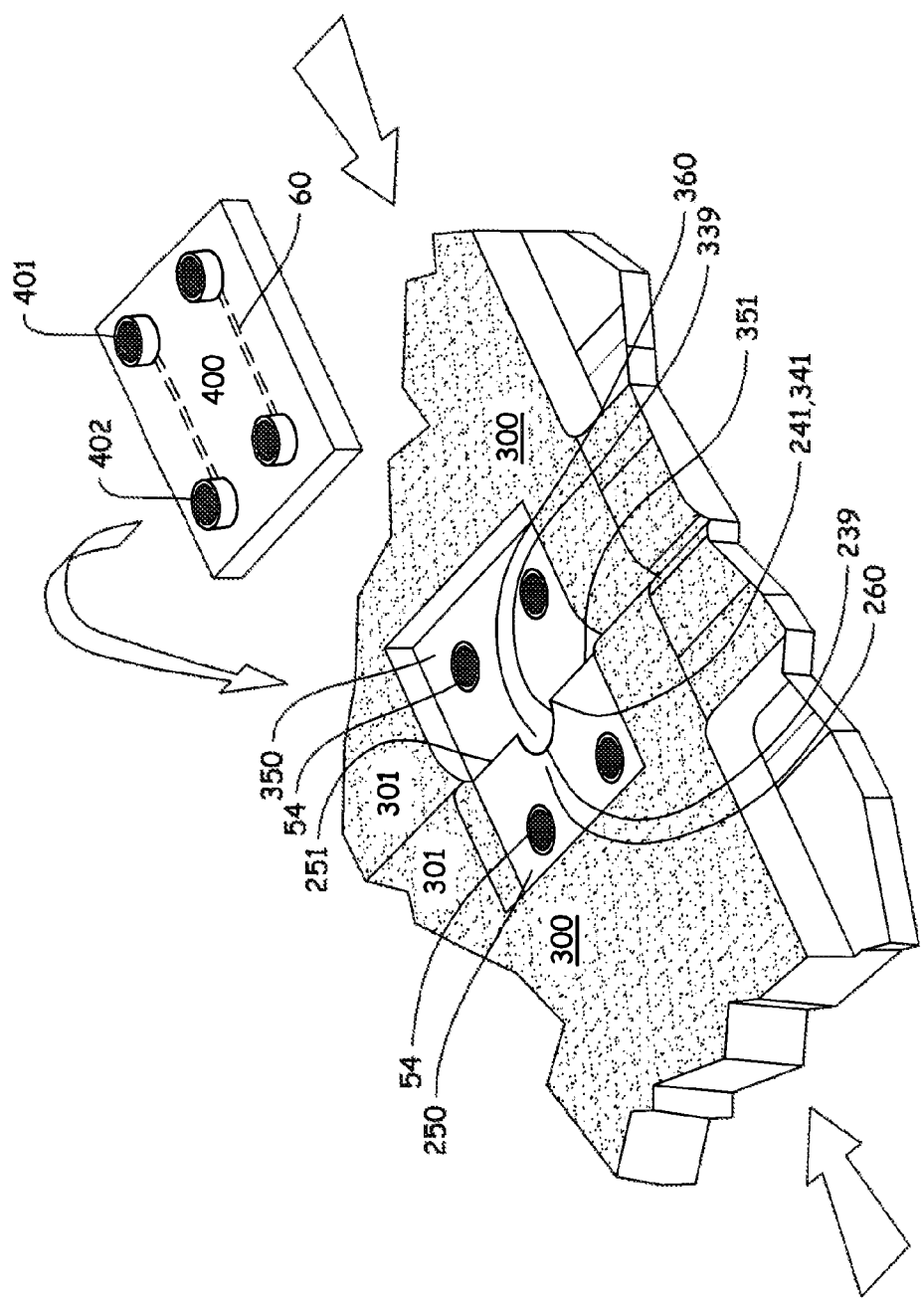
FIG. 18 is an exemplary illustration of an exploded view of another embodiment according to the present invention.
Figure 19:
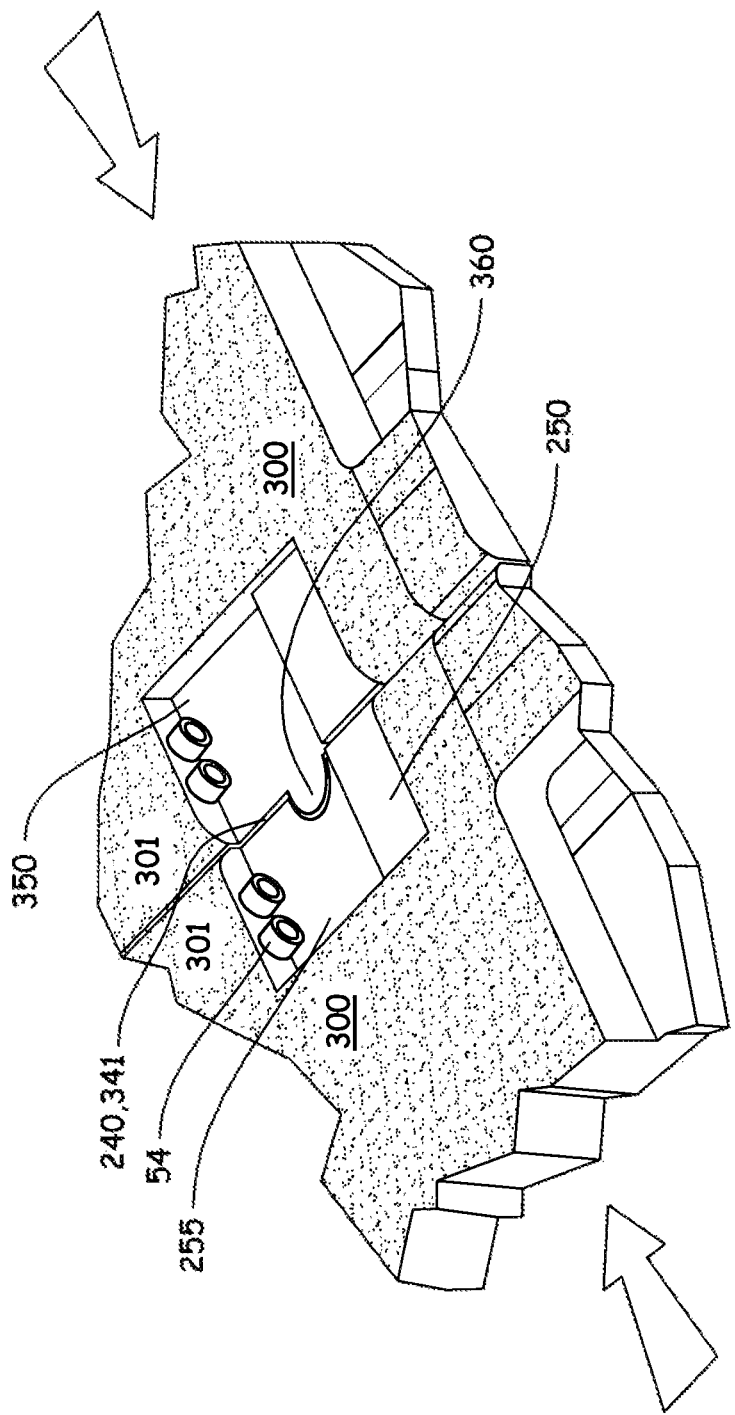
FIG. 19 is an exemplary illustration of an exploded view of another embodiment according to the present invention without the header connector shown.

Referring to FIGS. 18 though 20, an illustrative example of a third embodiment of the present invention is shown (FIG. 18 showing a straight top loading configuration and FIGS. 19 and 20 showing a sliding top loading configuration). The third embodiment is functionally similar to the first two embodiments discussed above, but accomplishes the function is a somewhat different fashion. In this embodiment, a photovoltaic device connector assembly 220 for connecting and locating a plurality of photovoltaic devices 300 may include a first receptacle connector housing 250 and a second receptacle connector housing 350. Furthermore, the first receptacle connector housing 250 may be at least partially connectively disposed on a side portion 301 (e.g. portions such as top, bottom, or sides) of a first photovoltaic device 300 and the second receptacle connector housing is at least partially connectively disposed on a side portion 301 of a second photovoltaic device 300.

It is contemplated that at least one first locator portion 260 may be located in a peripheral wall portion 251 of the first receptacle connector housing 250. At least one second locator portion 360 may be located in a peripheral wall portion 351 of the second receptacle connector housing 350. Wherein the second locator portion 360 may be geometrically complementary with the first locator portion 260. Further wherein the first and second locater portions 260, 360 may provide a rotationally adjustable location function between the first and second photovoltaic devices 300. As in the second embodiment, the locator portions 260, 360 may include bearing walls 239, 339 and gapping segments 241, 341.

The connector assembly 220 may also include at least one receptacle electrical terminal 54 at least partially encapsulated in each of the first and second receptacle connector housings 250, 350. This terminal being electrically connected to the PV device 300.

The connector assembly 220 may include a header connector element 400. The connector element 400 generally geometrically complementary to the two receptacle connector housings 250, 350. The connector element 400 may include at least first and second header electrical terminals 401, 402 (with an electrical element connected there between) and at least partially encapsulated in the header connector element. The first header electrical terminal 401 may be geometrically complementary with the receptacle electrical terminal 54 of the first receptacle connector housing 250 and the second header electrical terminal 402 geometrically complementary with the receptacle electrical terminal 54 of the second receptacle connector housing 350. Thus, when installed, completing an electrical circuit therebetween. It is also contemplated that the header connector element 400 and/or the receptacle housings 250, 350 may include a strain relieving feature or adjustable terminals to allow for a satisfactory electrical connection to the receptacle terminals due to any relative positional differences therebetween (e.g. rotationally adjusted devices, expansion, contraction, and/or movement of the devices).

As in the other embodiments, it is also contemplated that the connector element 400 and/or the receptacle housing 250, 350 may include at least one bypass diode 64, at least one signaling device 39, and/or at least one second electrically conductive member 65.

In a fourth embodiment, with one illustrative example shown in FIG. 22, an embodiment similar to that described in the first embodiment is contemplated. The primary difference between the fourth and first embodiments is that the header portions and receptacle portions of the connector system are reversed.

In another derivation of the present invention, with one illustrative example shown in FIG. 23, is contemplated. This derivation could be applied to any of the above embodiments. In this derivation, it is contemplated that the connector assembly 1000 on one side is integral to one PV device 1100 and is used to connect to a second PV device 1200. That is to say, one side of the connector assembly is affixed to (preferably permanently affixed) to one of the PV devices by either integrating it structurally into a PV device or affixing it thereto prior to installation of the PV devices.

In a fifth embodiment of the present invention, a method of locating and electrically connecting a plurality of photovoltaic devices together is contemplated. The method may include the steps of:

a. providing a first photovoltaic device with a first receptacle connector housing located on a side portion of the device, the receptacle connector housing including at least one first electrical connector terminal and at least one first locator feature; b. providing at least a second photovoltaic device with a second receptacle connector housing located on a side portion of the device, the second receptacle connector housing including at least one second electrical connector terminal and at least one second locator feature; c. providing a header connector according to any of the previously described embodiments; d. joining one end of the header connector to the first receptacle connector housing; e. joining the opposing end of the header connector to the second receptacle connector housing; f. rotationally locating the first and second photovoltaic devices to each other via the arcuate bearing wall of the header connector; and g. repeating steps c-f for each of the plurality of photovoltaic devices.

In a sixth embodiment of the present invention, a method of locating and electrically connecting a plurality of photovoltaic devices together is contemplated. The method may include the steps of:

a. providing a first photovoltaic device with a first receptacle connector housing located on a side portion of the device, the receptacle connector housing including at least one first electrical connector terminal and at least one first locator feature; providing at least a second photovoltaic device with a second receptacle connector housing located on a side portion of the device, the second receptacle connector housing including at least one second electrical connector terminal and at least one second locator feature, wherein the first receptacle connector housing is at least partially connectively disposed on a side portion of a first photovoltaic device and the second receptacle connector housing is at least partially connectively disposed on a side portion of a second photovoltaic device, further wherein the first and second locater portions provide a rotationally adjustable location function between the first and second photovoltaic device; b. providing a header connector according to the third aspect described above; c. rotationally locating the first and second photovoltaic devices to each other via the first and second locater portions; d. joining header connector element to the first and second receptacle connector housing; and e. repeating steps c-d for each of the plurality of photovoltaic devices.

In a seventh embodiment of the present invention, a method of locating and electrically connecting a plurality of photovoltaic devices together is contemplated. The method may include the steps of:

a. providing a first photovoltaic device with a first header connector housing located on a side portion of the device, the header connector housing including at least one first electrical connector terminal and at least one first locator feature; b. providing at least a second photovoltaic device with a second header connector housing located on a side portion of the device, the second receptacle connector housing including at least one second electrical connector terminal and at least one second locator feature; c. providing a receptacle connector according to claim 1; d. joining one end of the receptacle connector to the first header connector housing; e. joining the opposing end of the receptacle connector to the second header connector housing; f. rotationally locating the first and second photovoltaic devices to each other via the bearing wall of the receptacle connector; and g. repeating steps c-f for each of the plurality of photovoltaic devices.

Unless stated otherwise, dimensions and geometries of the various structures depicted herein are not intended to be restrictive of the invention, and other dimensions or geometries are possible. Plural structural components can be provided by a single integrated structure. Alternatively, a single integrated structure might be divided into separate plural components. In addition, while a feature of the present invention may have been described in the context of only one of the illustrated embodiments, such feature may be combined with one or more other features of other embodiments, for any given application. It will also be appreciated from the above that the fabrication of the unique structures herein and the operation thereof also constitute methods in accordance with the present invention.

The preferred embodiment of the present invention has been disclosed. A person of ordinary skill in the art would realize however, that certain modifications would come within the teachings of this invention. Therefore, the following claims should be studied to determine the true scope and content of the invention.

Any numerical values recited in the above application include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints.

The disclosures of all articles and references, including patent applications and publications, are incorporated by reference for all purposes.

The term "consisting essentially of" to describe a combination shall include the elements, ingredients, components or steps identified, and such other elements ingredients, components or steps that do not materially affect the basic and novel characteristics of the combination.

The use of the terms "comprising" or "including" to describe combinations of elements, ingredients, components or steps herein also contemplates embodiments that consist essentially of the elements, ingredients, components or steps.

Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps. All references herein to elements or metals belonging to a certain Group refer to the Periodic Table of the Elements published and copyrighted by CRC Press, Inc., 1989. Any reference to the Group or Groups shall be to the Group or Groups as reflected in this Periodic Table of the Elements using the IUPAC system for numbering groups.

What is claimed is:

1. A method of locating and electrically connecting a plurality of photovoltaic system components together comprising the steps of:
    a. providing a first photovoltaic system component with a first connector housing located on a side portion of the component, the connector housing including at least one first electrical connector terminal and at least one first locator feature;
    b. providing at least a second photovoltaic system component with a second connector housing located on a side portion of the component, the second connector housing including at least one second electrical connector terminal and at least one second locator feature;
    c. providing a connector that comprises i) a base portion including a first end portion, ii) a second portion, an intermediate portion and an outer surface; a locater portion located on the outer surface of the intermediate portion, the locator portion including a bearing wall that projects away from the outer surface and is shaped to generally complement an opposing connector housing in the photovoltaic device; and iii) at least one electrically conductive member that is substantially surround by the base portion and that spans between the first and second end portions and includes connective terminals at opposing ends that are shaped to interlock with an opposing terminal in the opposing connector housing; so that the bearing wall at least partially contacts an opposing surface in the connector housing;
    d. joining one end of the connector to the first connector housing;
    e. joining the opposing end of the connector to the second connector housing;
    f. rotationally locating the first and the second photovoltaic components to each other via the bearing wall of the connector; and
    g. repeating steps c-f for each of the plurality of photovoltaic system components.

2. A method of locating and electrically connecting a plurality of photovoltaic system components together comprising the steps of:
    a. providing a first photovoltaic system component with a first receptacle connector housing located on a side portion of the component, the receptacle connector housing including at least one first electrical connector terminal and at least one first locator feature;
    providing at least a second photovoltaic system component with a second receptacle connector housing located on a side portion of the component, the second receptacle connector housing including at least one second electrical connector terminal and at least one second locator feature, wherein the first receptacle connector housing is at least partially connectively disposed on a side portion of the first photovoltaic system component and the second receptacle connector housing is at least partially connectively disposed on a side portion of the second photovoltaic system component, further wherein the first and second locator features provide a rotationally adjustable location function between the first and second photovoltaic system components; and
    b. providing a header connector that comprises i) a base portion including a first end portion, ii) a second portion, an intermediate portion and an outer surface; a locater portion located on the outer surface of the intermediate portion, the locator portion including a bearing wall that projects away from the outer surface and is shaped to generally complement an opposing connector housing in the photovoltaic device; and iii) at least one electrically conductive member that is substantially surrounded by the base portion and that spans between the first and second end portions and includes connective terminals at opposing ends that are shaped to interlock with an opposing terminal in the opposing connector housing, so that the bearing wall at least partially contacts an opposing surface in the connector housing;

c. rotationally locating the first and the second photovoltaic system components to each other via the first and second locater portions;

d. joining the header connector to the first and the second receptacle connector housing; and e. repeating steps c-d for each of the plurality of photovoltaic system components.

* * * * *

UNITED STATES PATENT AND TRADEMARK OFFICE
CERTIFICATE OF CORRECTION

PATENT NO. : 8,740,642 B2  Page 1 of 1
APPLICATION NO. : 12/989742
DATED : June 3, 2014
INVENTOR(S) : Keenihan et al.

It is certified that error appears in the above-identified patent and that said Letters Patent is hereby corrected as shown below:

In the Claims

Column 12, Line 16, delete "a second portion" and insert --a second end portion--

Column 12, Line 23, delete "surround" and insert --surrounded--

Column 12, Line 27, delete ";" after "connector housing" and insert --,--

Column 12, Line 58, delete "locator features provide" and insert --locator portions provide--

Column 12, Line 61, delete "connector that comprises" and insert --connector according to claim 1 that comprises--

Signed and Sealed this
Twenty-third Day of September, 2014

Michelle K. Lee
*Deputy Director of the United States Patent and Trademark Office*